United States Patent [19]

Dannhäuser et al.

[11] 4,131,339
[45] Dec. 26, 1978

[54] POWER DIODE

[75] Inventors: Friedrich Dannhäuser; Alfred Porst, both of Munich, Germany

[73] Assignee: Siemens Aktiengesellschaft, Munich, Germany

[21] Appl. No.: 768,940

[22] Filed: Feb. 15, 1977

[30] Foreign Application Priority Data

Mar. 1, 1976 [DE] Fed. Rep. of Germany ....... 2608432

[51] Int. Cl.² .......................................... H01L 29/90
[52] U.S. Cl. ....................................... 357/13; 357/89; 357/90
[58] Field of Search ........................... 357/13, 89, 90

[56] References Cited

U.S. PATENT DOCUMENTS 3,959,646  5/1976  Cremoux .................................. 357/13
4,041,515  8/1977  Chang ..................................... 357/13

Primary Examiner—Edward J. Wojciechowicz
Attorney, Agent, or Firm—C. L. Menzemer

[57] ABSTRACT

The present invention concerns a power diode with a semiconductor body having an inner zone with a given thickness and a given specific resistance, and having on each side of said inner zone at least one outer zone which adjoins the inner zone and has a lower specific resistance in comparison with the inner zone. The diode is characterized in that the specific resistance and the thickness of the inner zone are so adapted to each other that $U_B < U_{pT}$, wherein $U_B$ is the avalanche voltage, and $U_{pT}$ is the voltage at which the space-charge zone includes the entire relatively lightly doped inner zone.

4 Claims, 5 Drawing Figures

POWER DIODE

BACKGROUND OF THE INVENTION

1. Field of Invention

The present invention is in the field of discrete power semiconductor devices in general and discrete power diodes in particular.

2. Prior Art

Power diodes of the type this invention is concerned with are generally known and are used for various applications. In order to attenuate overvoltages which occur in the commutation process, i.e. in the reversal of the direction of the current in the diode, power diodes are provided with protective circuits which mostly consist of an RC combination.

In the commutation of the load current, destructive overvoltages can occur in such circuits which cannot be prevented even with the above-mentioned RC circuits. This is due to the fact that the protective circuits themselves are inductive even though slightly, so that an additional voltage occurs therein which corresponds to the decrease of the current in the diode.

Investigations have shown that one must distinguish essentially between conditions in connection with the commutation of the current in a power diode. These conditions are illustrated in FIG. 1. The current pattern can be divided into two partial ranges, the first one of which extends in time up to the point $t_0$. Up to the point $t_0$, the current initially drops from a stationary value steadily towards zero. A reverse current then flows up to the point in time $t_0$, designated A in FIG. 1, which is essentially caused by the reduction of those charge carriers in the middle zone of the diode which have flooded the middle zone in the forward direction. At the point in time $t_0$, the number of free charge carriers has reached the doping concentration at a boundary to one of the higher doped zones. Following the point in time $t_0$, a potential on the power diode builds up, whereby a spacecharge zone is formed, starting in almost all cases from the pn junction.

The potential which then builds up on the diode opposes the EMF of the circuit and results in a decrease of the reverse current which is caused by the driving out of the carriers, denoted as B in FIG. 1. In this case, the current curve may, as shown by curve $i_1$, drop to zero gradually or it may as shown by curve $i_2$, drop to zero rapidly, i.e. it can practically collapse.

The illustrated different current patterns produce, together with the inductances in the circuit, qualitatively and quantitatively distinct potential patterns on the diode. While, with a gradual attenuation of the current $i_1$, the voltage $U_1$ overshoots only relatively little before reaching the EMF, the abruptly falling current $i_2$ causes voltage $U_2$ to overshoot considerably. This can result in the destruction of the diode.

SUMMARY OF THE INVENTION

The present invention consists of a power diode comprising a first zone of a given thickness and a given specific resistance, at least one other zone adjacent to at least one of two opposed major surfaces of said inner zone, said at least one other adjacent zones having a lower specific resistance than said first zone and the specific resistance and thickness of the first zone being so adapted to each other that $U_B < U_{pT}$, wherein $U_B$ is the avalanche voltage and $U_{pT}$ is the potential at which the space-charge zone includes the entire inner zone.

BRIEF DESCRIPTION OF THE DRAWINGS

For a better understanding of the nature of the invention, reference should be had to the following detailed description and drawings, in which.

DESCRIPTION OF PREFERRED EMBODIMENTS

Preferred embodiments of the present invention will now be described with reference to FIGS. 2 to 5.

Figure 1:
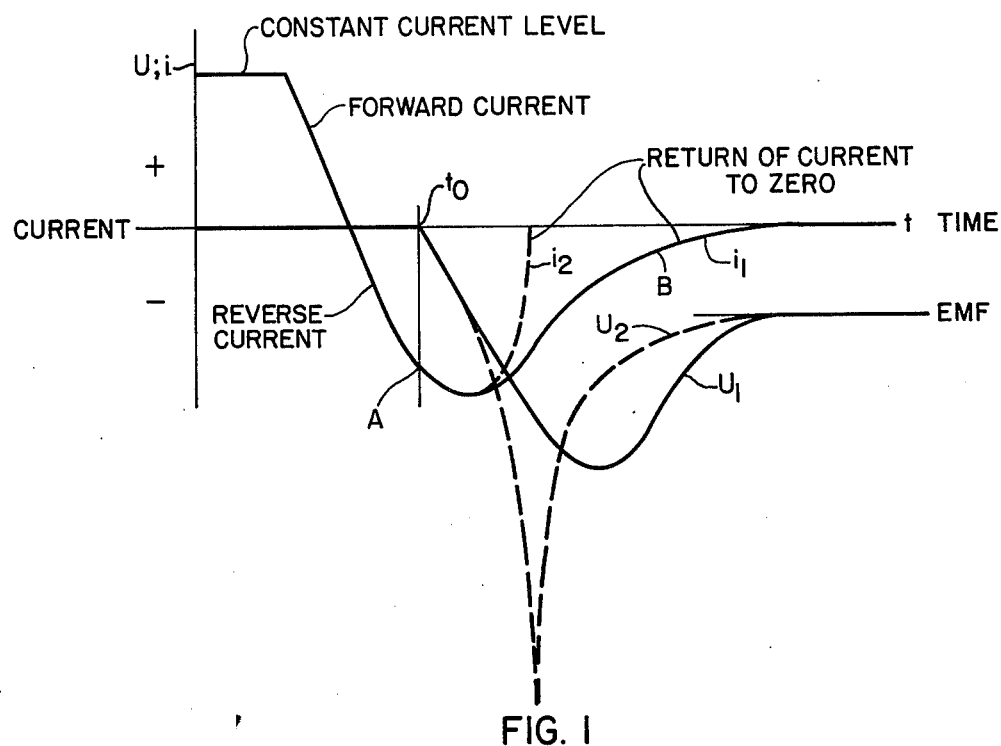
FIG. 1 is a current-voltage v. time plot of the commutation process in a prior art diode.
Figure 2:
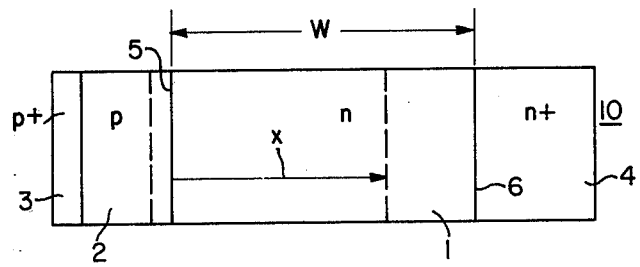
FIG. 2 is a schematic diagram of a diode incorporating the teachings of this invention.

FIG. 2 schematically shows a semiconductor body 10 of a power diode.

The semiconductor body 10 has an inner or base zone 1 shown, for example, to be n doped. The thickness of the inner or base zone 1 is indicated by W. A first outer zone 2, which is p doped, is provided adjacent one side of the inner zone 1. A heavily p+doped zone 3 may be provided adjacent zone 2 to facilitate making ohmic contact to zone 2. A pn junction 5 lies between the middle zone 1 and the outer zone 2. An n doped zone 4 is located on the other side of the inner zone 1. Between the inner zone 1 and the outer zone 4 is an interface 6 which is particularly distinct, i.e. abrupt if the zone 4 has been produced by alloying. In case zone 4 has been produced by diffusion, the doping pattern increases gradually. The difference between an abrupt and a gradual increase in doping has, however, hardly any significance in practice because the space-charge zone can spread only in the inner zone 1, whereas zones 2 and 4 can hardly accept any voltage because of their considerably higher doping.

Figure 3:
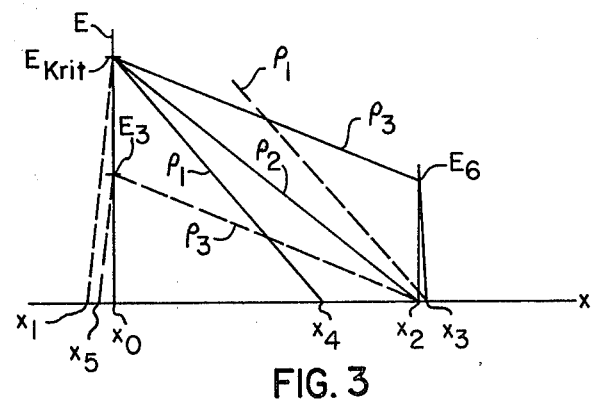
FIG. 3 is a plot of field intensity or field distribution pattern within the diode of FIG. 2.

When a blocking potential is applied to the semiconductor body, the pattern of field intensity, as shown in FIG. 3, develops throughout the penetration depth of the space-charge zone indicated by a broken line in FIG. 2. For the sake of clarity, the portion of the space-charge zone extending into the zone 2 is drawn excessively thick. In FIG. 3, various patterns of field intensity are plotted with the specific resistance of $\rho$ of the inner zone 1 as parameter, wherein case $\rho_3 > \rho_2 > \rho_1$. The various patterns of field intensity which are shown have different effects; as follows.

If the inner zone, for a given width W, has a specific resistance $\rho_3$, the maximum blocking potential $U_{B3}$ is determined by the area of the polygon $x_1E_{Krit}Ex_3$ of FIG. 3, which means that, with a specific resistance $\rho_3$, the space-charge zone extends up to the boundary 6 or, in the case of a diffused zone, even somewhat into zone 4. However, for the commutation, which is a dynamic process, one must take into consideration that, for this specific resistance $\rho_3$, the space-charge zone comprises the total inner zone 1 with a smaller potential $U_{pT}$ which is determined by the triangle $E_3x_2x_5$. Upon commutation of the current, the charge carriers which are in zone 1 are initially drained off, starting at the pn junction 5, FIG. 2. With this, a space-charge zone is developed. If, during the commutation, the punch-through potential $U_{pT}$ is reached, all free charge carriers must be drained from the middle zone 1, and the reverse current through the diode breaks down. This results in the initially mentioned overvoltage which endanger the component. These overvoltages occur already at potentials which are smaller than $U_B$. This condition can thus be described as $U_{pT} < U_B$.

The next case to be considered is one in which, for the same width W of zone 1, the specific resistance is reduced such that the space-charge zone just touches the interface 6 between zones 1 and 4 upon reaching the field intensity $E_{Krit}$ at the pn junction 5. The maximum blocking potential $U_B$ is now determined by the points in FIG. 3 $x_1E_{Krit}x_2$. Now a breakdown of the current can only occur at a potential which corresponds to the maximum blocking potential. In this case, therefore, $U_B = U_{pT}$.

If, with constant width W, the specific resistance $\rho_2$ of the inner zone 1 is reduced to $\rho_1$, the blocking potential $U_B$ at the rectifier is determined by the area $x_0$, or $x_1E_{Krit}x_4$, respectively. Because the mentioned potential $U_{B1}$ cannot be exceeded, charge carriers are still available, even upon reaching this potential in a region of zone 1 which lies between $x_4$ and $x_2$, which charge carriers are sufficient to allow the reverse current to decay gently. With this dimensioning, an abrupt breakdown of the reverse current resulting in critical overvoltage in inductive circuits is avoided.

Figure 4:
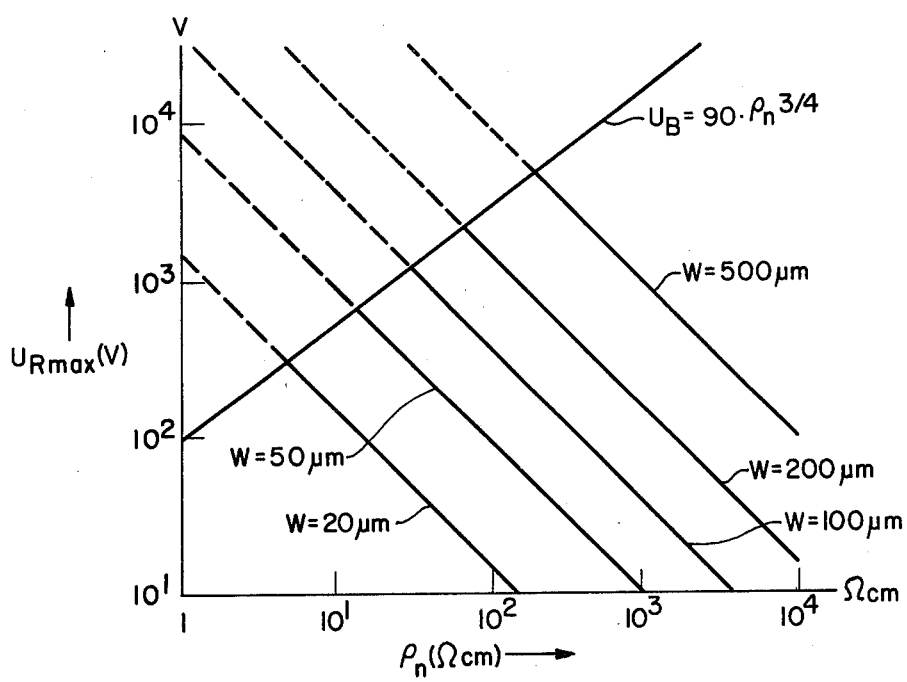
FIG. 4 is a plot showing graphically the relationship between maximum blocking potential, punch through potential, ohmic resistance of the inner zone and the thickness of the inner zone of a diode incorporating the teaching of this invention.

To show the basis for the requirement $U_B < U_{pT}$, FIG. 4 sets forth the dependence of the maximum blocking potential $U_B$ and of the punch-through potential upon the ohmic resistance of the inner zone 1, with the thickness W of this zone taken as the parameter. Use being made in this context of the known relationships for n doped silicon and abrupt pn junctions.

$$U_B = 90 \cdot \rho^{\frac{3}{4}}$$

$$U_{pT} = \frac{W^2}{\epsilon\epsilon_o / U\rho}$$

In general, it can be said that the requirement $U_B < U_{pT}$ is fulfilled when, for a given width of the inner zone 1, the specific resistance of the inner zone 1 is selected such that it is to the left of the intersection $U_B = U_{pT}$. This will result in a slight loss of blocking potential but it is more important to avoid a collapse in most applications of the current.

Figure 5:
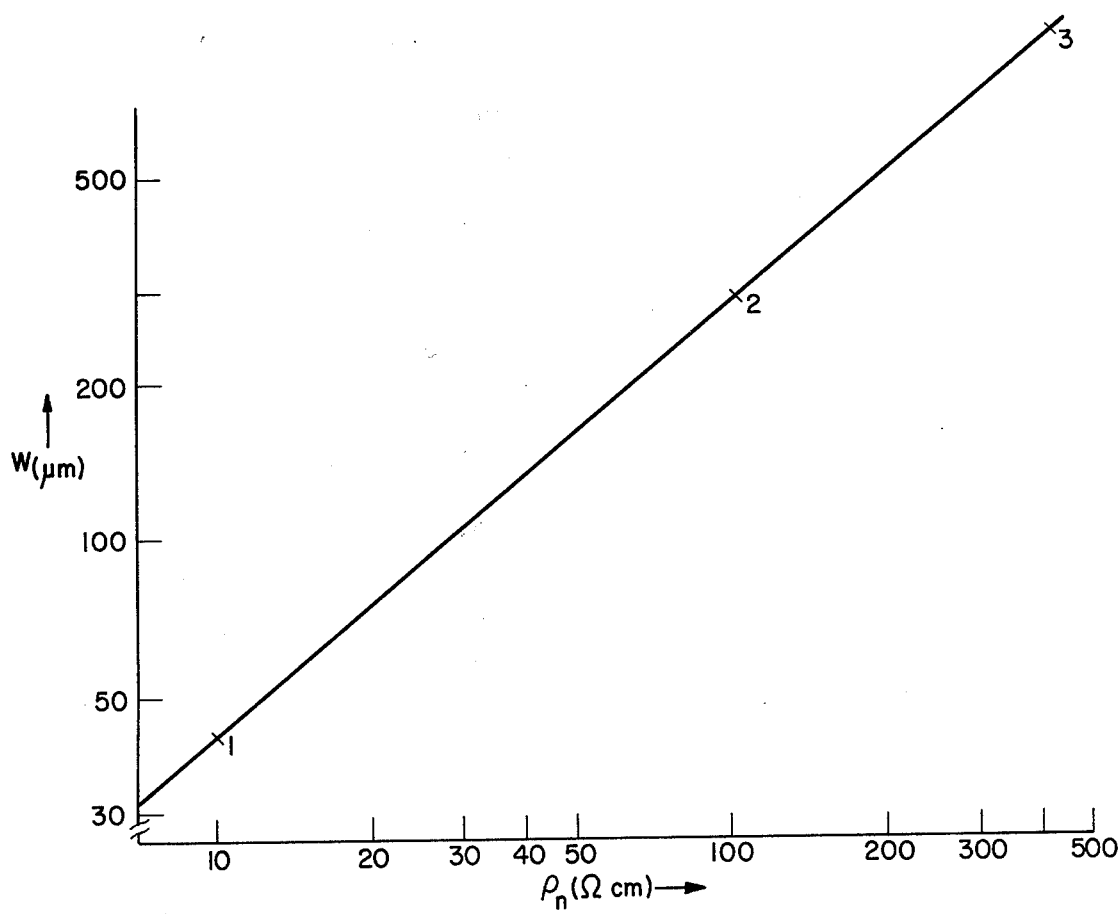
FIG. 5 is a plot of $U_B$ v. $U_{pT}$.

As an example, the limit curve for $U_B = U_{pT}$, which was plotted in accordance with the above equations, is drawn in FIG. 5. A breakdown or collapse of the reverse current does not occur above this limit curve. If the thickness W and the doping are so selected that the corresponding coordinates lie below this limit curve, a breakdown of the reverse current is possible.

The following are examples of embodiments for power diodes with an abrupt pn junction and n silicon, wherein the reverse current will not collapse:

1. $\rho = 10$ Ohm $\cdot$ cm, W = 45 $\mu$m,
2. $\rho = 100$ Ohm $\cdot$ cm, W = 330 $\mu$m,
3. $\rho = 400$ Ohm $\cdot$ cm, W = 1050 $\mu$m.

We claim as our invention:

1. A power diode comprising a body of semiconductor material, said body containing a first zone of a given thickness and a given specific resistance and having a first-type conductivity, an outer zone adjacent to one of two opposed major surfaces of said first zone, said outer zone being of the same semiconductor material as said first zone, having a lower specific resistance than said first zone and having a second-type conductivity, a p-n junction only between said first zone and said outer zone, another outer zone adjacent to the other opposed major surface of said first zone, said another zone being of the same semiconductor material as said first zone, said another outer zone having said first-type conductivity, and being doped to a higher concentration than said first zone, ohmic electrical contact being made to only said outer zone and said another outer zone, the specific resistance and thickness of the first zone being so adapted to each other the $U_B < U_{pT}$, wherein $U_B$ is the avalanche voltage and $U_{pT}$ is the potential at which the space charge zone includes the entire first zone.

2. The power diode of claim 1 in which the first zone is n-type silicon, the outer zone is p-type silicon, a p-n junction only between said first zone and said outer zone.

3. The power diode of claim 2 in which the thickness of said first zone varies from 45 $\mu$m to 1050 $\mu$m and the specific resistance of said first zone varies from 10 ohm-cm, when the thickness is 45 $\mu$m, to 400 ohm-cm when the thickness is 1050 $\mu$m.

4. The power diode of claim 2 in which the another outer zone is of n-type silicon and is doped to higher concentration that said inner zone.

* * * * *